(12) United States Patent
Naem

(10) Patent No.: US 6,406,966 B1
(45) Date of Patent: Jun. 18, 2002

(54) UNIFORM EMITTER FORMATION USING SELECTIVE LASER RECRYSTALLIZATION

(75) Inventor: Abdalla A. Naem, Brussels (BE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/708,261

(22) Filed: Nov. 7, 2000

(51) Int. Cl.$^7$ .............................................. H01L 21/331
(52) U.S. Cl. ...................................... 438/378; 438/365
(58) Field of Search ................................ 438/320, 378, 438/364, 365, 346, 760, 646

(56) References Cited

U.S. PATENT DOCUMENTS

| | | | |
|---|---|---|---|
| 3,915,767 A | * 10/1975 | Welliver ...................... | 438/346 |
| 4,407,060 A | * 10/1983 | Sakurai ....................... | 438/345 |
| 4,415,383 A | 11/1983 | Naem et al. ................. | 148/187 |
| 4,476,475 A | 10/1984 | Naem et al. ................ | 357/23.7 |
| 4,584,025 A | * 4/1986 | Takaoka et al. ............ | 438/311 |
| 5,225,371 A | * 7/1993 | Sexton et al. ................ | 117/43 |
| 5,933,720 A | * 8/1999 | Yokoyama et al. ......... | 438/202 |

* cited by examiner

Primary Examiner—John F. Niebling
Assistant Examiner—Christopher Lattin
(74) Attorney, Agent, or Firm—Stallman & Pollock LLP

(57) ABSTRACT

Method is provided for forming an emitter structure in a semiconductor integrated circuit bipolar transistor structure. The bipolar transistor structure includes a collector region that has a first conductivity type formed in a semiconductor substrate and a base region having a second conductivity type, opposite the first conductivity type, formed in the collector region. A layer of dielectric material is formed on the surface of the base region. An emitter window is opened in the layer of dielectric material to expose a surface area of the base region. A layer of conductive material is then formed over the layer of dielectric material and extending into the emitter window such that at least a portion of the layer of conductive material is in contact with the surface area of the base region. Dopant of the first conductivity type is then introduced into the layer of conductive material. A region of anti-reflective coating (ARC) material is formed on the layer of conductive material over the emitter window opening such that portions of the layer of the conductive material are exposed. Sufficient laser energy is then applied to the structure resulting from the foregoing steps to cause the conductive material underlying the region of anti-reflective coating material to flow. The region of anti-reflective coating material is then removed and the conductive material is patterned to define an emitter region that extends into the emitter window opening and in interfacial contact with the surface area of the base region.

6 Claims, 1 Drawing Sheet

UNIFORM EMITTER FORMATION USING SELECTIVE LASER RECRYSTALLIZATION

BACKGROUND OF THE INVENTION

1. Field of the Invention

The present invention relates to the fabrication of semiconductor integrated circuit structures and, in particular, to the utilization of selective laser recrystallization for the formation of uniform emitter/base junctions and highly uniformly doped emitter electrodes in bipolar transistor structures.

2. Discussion of the Related Art

FIG. 1 illustrates several problems resulting from the formation of the emitters of bipolar transistors utilizing conventional integrated circuit fabrication techniques. First, variations in the vertical thickness of the emitter polysilicon film in the emitter window causes non-uniform doping of the emitter poly; this results in a non-uniform doping profile in the emitter region when ion implantation is used, which causes process non-uniformity and, therefore, device performance variations. Second, incomplete filling of the emitter window with emitter polysilicon creates voids, resulting in a non-uniform emitter/base contact interface due to emitter narrowing; this leads to a smaller and non-reproducible emitter/base junction interfacial area. Third, insufficient dopant activation using conventional annealing techniques results in lower current gain in the bipolar device.

SUMMARY OF THE INVENTION

The present invention utilizes selective laser recrystallization of emitter polysilicon for the formation of uniform emitter/base junctions and highly uniformly doped emitter electrodes using conventional ion implant doping and polysilicon deposition techniques.

Thus, the present invention is directed to a method of forming an emitter structure in a semiconductor integrated circuit bipolar transistor structure. The bipolar transistor structure includes a collector region of a first conductivity type formed in a semiconductor substrate and a base region of a second conductivity type, opposite the first conductivity type, formed in the collector region. A layer of dielectric material is formed on the surface of the base region. An emitter window is then opened in the dielectric material to expose a surface area of the base region. Conductive material is then formed over the layer of dielectric material and extending into the emitter window such that at least a portion of the layer of conductive material is in contact with the surface area of the base region. Dopant of the first conductivity type is then introduced into the layer of conductive material. A region of anti-reflective coating (ARC) material is formed on the layer of conductive material over the emitter window opening such that portions of the layer of the conductive material are exposed. Sufficient laser energy is then applied to the structure resulting from the foregoing steps to cause the conductive material underlying the region of anti-reflective coating to melt and flow. The anti-reflective coating material is then removed and the laser annealed conductive material is patterned to define an emitter region that extends into the emitter window opening and in interfacial contact with the surface area of the base region.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
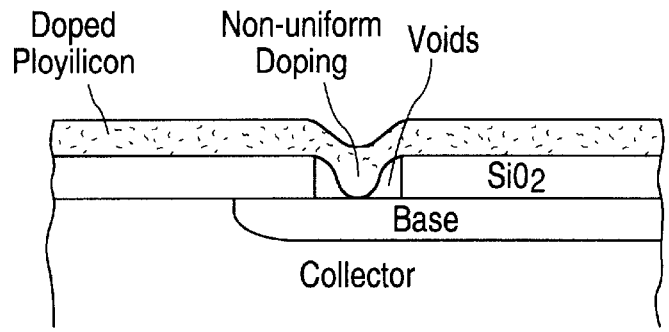
FIG. 1 is a partial cross-section view illustrating a conventional polysilicon emitter structure.
Figure 2:
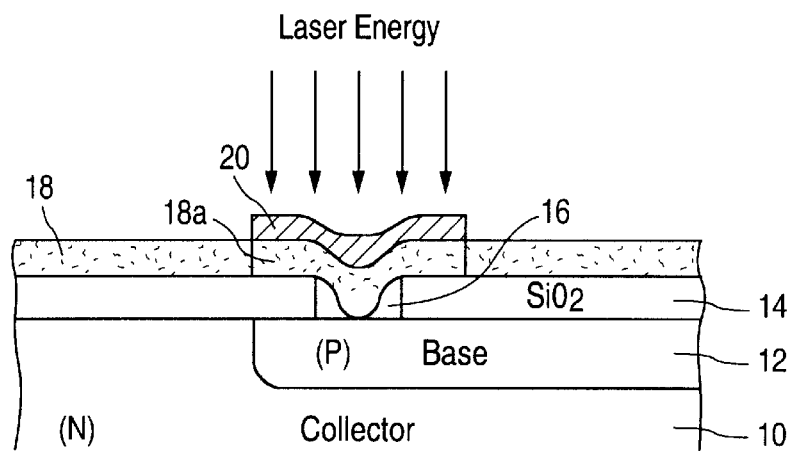
FIG. 2. is a partial cross-section view illustrating steps in a method for forming a polysilicon emitter structure in accordance with the concepts of the present invention.

FIG. 2 shows structural elements of a conventional npn bipolar transistor structure, including a N-type collector region 10 formed in a crystalline silicon substrate and a P-type base region 12 formed in the N-type collector region 10. A layer 14 of dielectric material, preferably silicon dioxide, is formed on the surface of the P-type base region 12. An emitter window opening 16 is formed in the layer 14 of dielectric material using conventional photolithographic/etching techniques to expose a surface area of the base region 12. A layer 18 of conductive material, preferably polysilicon, is formed over the layer 14 of dielectric material and extending into the emitter window opening 16 such that at least a portion of the layer 18 of conductive material is in contact with the surface area of the base region 12. N-type dopant, typically arsenic or phosphorous, is then introduced into the layer 18 of conductive material, preferably by ion implantation. In the case of polysilicon, the conductive layer 18 is typically about 2000 Angstroms thick and has a dopant concentration of about 2E20 per cubic centimeter.

Next, in accordance with the concepts of the present invention, a layer of anti-reflective coating (ARC) material, for example $Si_3N_4$, is then formed on the layer 18 of conductive material and patterned, using conventional photolithographic/etching techniques, to form a region 20 of ARC material on the layer 18 of conductive material and over the emitter window opening 16 in the layer 14 of dielectric material such that portions of the layer 18 of conductive material are exposed. If the conductive layer 18 is polysilicon as described above, then the ARC material 20 can be about 600 Angstroms of LPCVD silicon nitride that is deposited on the implanted polysilicon 18 at about 700 degrees Centigrade. Sufficient laser energy is then applied to the foregoing structure, for example, using a CW Argon laser system, to cause the conductive material 18a underlying the region 20 of ARC material to melt and thereafter to flow. Silicon nitride is transparent at the Argon laser wavelength (500nm) and its reflective index is less than that of polysilicon and very close to the ideal value for minimum reflection. These optical properties of silicon nitride ensure maximum absorption of the laser energy that is required to melt the underlying polysilicon 18a The amount of radiation energy absorbed by the polysilicon 18a beneath the silicon nitride region 20 is also critically dependent on the thickness of the nitride 20. Therefore, the choice of about 600 Angstroms thick nitride ARC layer is crucial for successful selective laser annealing. Of course, those skilled in the art will appreciate that the thickness of the ARC material 20 will depend on the nature and thickness of the underlying conductive material 18.

As mentioned above, preferably, the laser annealing is performed using a continuous wave (CW) Argon laser set to produce a beam diameter of about 50um, an output power of about 11 watts, and a scanning speed of about 100 cmls.

The application of a selective laser annealing technique allows the heating up of only the desired emitter area, without effecting adjacent (e.g. CMOS) devices, making this approach highly desirable for BiCMOS process applications. That is, only that doped emitter polysilicon 18a that is covered with ARC material (e.g. $Si_3N_4$) 20 will heat up to the desired local temperature, which should be greater than about 1200° C.

As mentioned above, selective heating of the doped polysilicon can be achieved by depositing silicon nitride film on top of the emitter poly, which significantly reduces the laser beam reflection and allows for local absorption of the laser energy in the emitter polysilicon region 18a. Melting the emitter polysilicon 18a in this manner converts the emitter electrode to single crystal material, or large grains.

Figure 3:
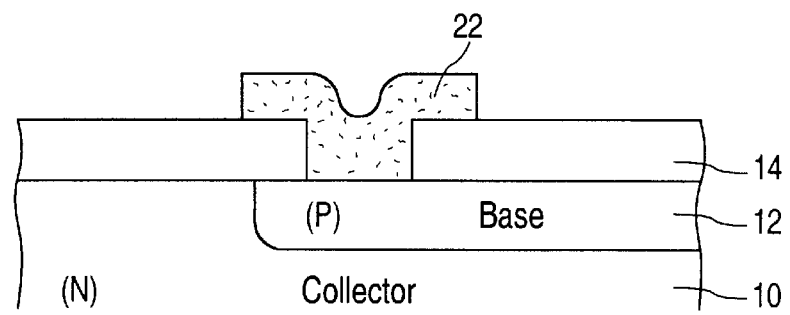
FIG. 3 is a partial cross-section view illustrating a polysilicon emitter structure formed in accordance with the concepts of the present invention.

Melting the emitter polysilicon as discussed above results in the filling of the emitter window, resulting in a uniform emitter/base junction along the emitter width, as shown in FIG. 3. Melting the emitter polysilicon also allows for uniform dopant distribution throughout the emitter thickness down to the emitter/base junction, thereby eliminating the plugging effect discussed above. Laser annealing also results in uniform and a high degree of dopant activation due to the high localized temperature (1200° C.) caused by the anti-reflective coating.

As shown in FIG. 3, following the laser energy induced flow of the conductive material 18a, the region 20 of ARC material is removed, preferably by dry etching. The layer 18 of conductive material is then patterned using conventional techniques to define an N-type emitter region 22 that extends into the emitter window opening 16 in the layer 14 of dielectric material and in interfacial contact with the surface area of the base region 12.

Those skilled in the art will appreciate that, although the embodiment of the invention described above is directed to a npn bipolar transistor structure, the concepts of the invention are equally applicable to pnp bipolar transistor structures.

Given the above detailed description of the invention and the embodiments of the invention described therein, it is intended that the following claims define the scope of the invention and that structures and methods within the scope of these claims and their equivalents be covered thereby.

What is claimed is:

1. A method of forming an emitter structure in a semiconductor integrated circuit bipolar transistor structure, the bipolar transistor structure including a collector region having a first conductivity type formed in a semiconductor substrate and a base region having a second conductivity type, opposite the first conductivity type, formed in the collector region, the method comprising:

forming a layer of dielectric material on a surface of the base region;

forming an emitter window opening in the layer of dielectric material to expose a surface area of the base region;

forming a layer of conductive material over the layer of dielectric material and extending into the emitter window opening such that at least a portion of the layer of conductive material is in contact with the surface area of the base region;

introducing dopant of the first conductivity type into the layer of conductive material;

forming a layer of anti-reflective coating (ARC) material on the layer of doped conductive material;

patterning the layer of anti-reflective coating (ARC) material to form a region of anti-reflective coating (ARC) material on the layer of conductive material and over the emitter window opening in the layer of dielectric material and that extends laterally only partially beyond the emitter window opening such that portions of the layer of doped conductive material are exposed;

applying sufficient laser energy to the structure resulting from the foregoing steps to cause the doped conductive material underlying the region of ARC material to flow;

removing the region of ARC material; and patterning the layer of doped conductive material to define an emitter region that extends into the emitter window opening in the layer of dielectric material and in interfacial contact with the surface area of the base region.

2. A method as in claim 1, and wherein the bipolar transistor structure is an npn bipolar transistor structure.

3. A method as in claim 1, and wherein the dielectric material comprises silicon dioxide.

4. A method as in claim 1, and wherein the conductive material comprises polysilicon.

5. A method as in claim 1, and wherein the anti-reflective coating material comprises silicon nitride.

6. A method as in claim 1, and wherein the laser energy is applied utilizing a continuous wave Argon laser system.

* * * * *